US006794949B1

(12) United States Patent
Bhagavatheeswaran et al.

(10) Patent No.: US 6,794,949 B1
(45) Date of Patent: Sep. 21, 2004

(54) FREQUENCY GENERATING DEVICE AND METHOD THEREOF

(75) Inventors: Gayathri Bhagavatheeswaran, Austin, TX (US); Christopher Chun, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/402,647

(22) Filed: Mar. 28, 2003

(51) Int. Cl.[7] .................................................. H03F 1/00
(52) U.S. Cl. ................... 331/160; 331/1 A; 331/177 R; 331/16
(58) Field of Search .............................. 331/1 A, 177 R, 331/16, 160

(56) References Cited

U.S. PATENT DOCUMENTS

| | | | | |
|---|---|---|---|---|
| 4,567,448 A | * | 1/1986 | Ikeda | 331/25 |
| 4,904,955 A | * | 2/1990 | Ley | 331/25 |
| 5,378,935 A | | 1/1995 | Korhonen et al. | |
| 5,748,044 A | * | 5/1998 | Xue | 331/16 |
| 6,157,247 A | | 12/2000 | Abdesselem et al. | |

* cited by examiner

*Primary Examiner*—Michael B. Shingleton
(74) *Attorney, Agent, or Firm*—Toler, Larson & Abel, LLP

(57) ABSTRACT

A system and method of varying frequency is disclosed. A first oscillator in a phase-locked loop (PLL) maintains a first frequency as part of the PLL lock. A second oscillator having a control coupled to the PLL can be modified to generate a frequency different than that of the PLL. This is accomplished while maintaining lock of the PLL.

27 Claims, 3 Drawing Sheets

FREQUENCY GENERATING DEVICE AND METHOD THEREOF

BACKGROUND

With scaling of technology, the reduction of power and leakage current to extend battery life by utilizing specialized design techniques has become more desirable. One such specialized technique is to reduce the frequency of a clock signal and/or to adjust the supply voltage to reduce power consumption of digital circuitry while maintaining adequate performance of the device.

In digital circuits, power consumption typically varies linearly with the frequency of operation. Various methods of stopping system clocks, or lowering the operating frequency of system clocks, have been used. One such technique to reduce the operating frequency of a system clock is to change the multiplication/divide ratio of a phase locked-loop. By changing the multiplication ratio of a phase locked-loop, the output frequency of the phase locked-loop is varied. However, changing the multiplication ratio of a phase locked-loop is not a very robust technique, in that the phase locked-loop may as a result lose lock, which can go undetected, whereby a system failure would occur. Alternatively, even when the loss of a lock is detected, it takes time for a new phase locked-loop frequency, based upon a new multiplication ratio, to settle in, which may result in unpredictable system operation.

Therefore, a method of overcoming these problems would be desirable.

FIELD OF THE DISCLOSURE

The present disclosure relates generally to frequency generating devices, and more specifically to a frequency generating device and method using a phase locked-loop.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

In a specific embodiment of the present disclosure, a phase locked-loop (PLL) generates a frequency at a first oscillator based upon a signal at a feedback node of the phase locked-loop. Also coupled to the feedback node of the phase locked-loop is a second oscillator used to generate a second frequency based upon the signal at the feedback node. During normal operation, the second oscillator can operate at the same frequency as the first oscillator, or at a predefined ratio of the first oscillator frequency. The output of the first oscillator is fed back as part of the phase locked-loop circuit to maintain a locked signal. The frequency associated with a signal generated by the second oscillator is provided to logic portions of a system to facilitate operation of the logic portions. When it is determined that the logic portion should operate at a different frequency, a specific control characteristic of the second oscillator is modified to generate the different frequency. The different frequency is generated by the second oscillator while the first oscillator maintains its original frequency within the phase locked-loop, thereby assuring lock of the phase locked-loop is maintained. Such a device and method is beneficial, in that it allows for system logic clocked by the second oscillator to consume less power as a result of the lower frequency being requested, while assuring a locked frequency of the phase locked-loop. In addition, a lower frequency can be quickly obtained for use by the system. Because the quantity of logic implementing the phase locked-loop is typically small relative to the system logic, the amount and impact of power consumed as a result of maintaining the original frequency is minimal. Specific implementations will be better understood with reference to FIGS. 1–5, which illustrate specific embodiments not intended to be limiting in nature.

Figure 1:
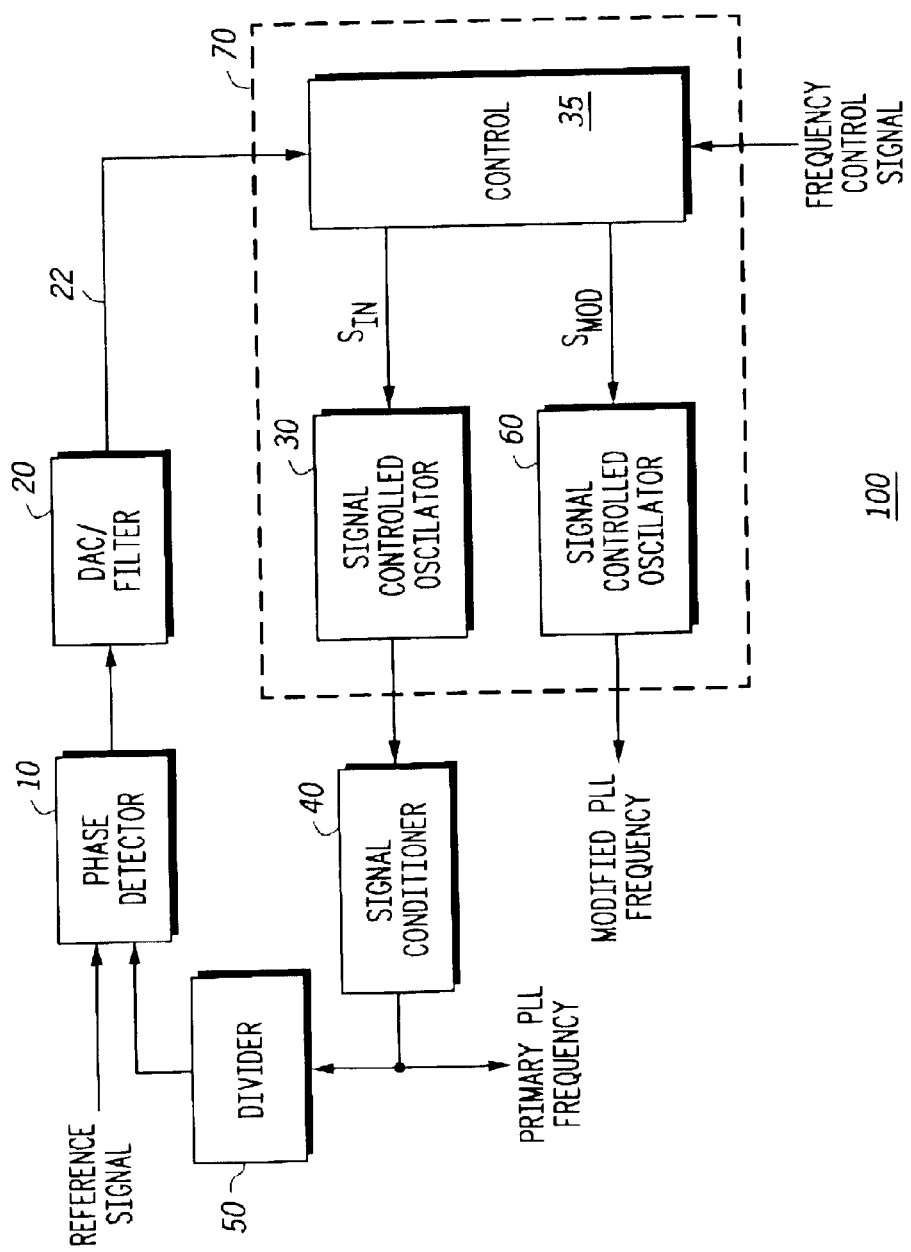
FIG. 1 describes, in block diagram form, a system in accordance with the present disclosure.

FIG. 1 illustrates a Phase Locked-Loop Device 100 comprising a Phase Detector 10, a Digital to Digital to Analog Converter/Filter Module 20, Control Module 35, a Signal Controlled Oscillator 30, a Signal Controlled Oscillator 60, a Signal Conditioner 40, and a Divider 50.

In operation, the Phase Detector 10 receives a Reference Signal and a signal from an output of the Divider 50. The Phase Detector 10 generates a digital value that indicates the phase difference between the Reference Signal and the output from the Divider 50. This value is provided to a Digital to Digital to Analog Converter/Filter Module 20.

The Digital to Analog Converter/Filler Module 20 converts the phase difference value received from the Phase Detector 10 into an Analog Signal 22 and performs any filtering of this signal as may be useful. The output of the Module 20 is typically an analog control signal that is provided to the Control Module 35.

The Control Module 35 receives the Analog Signal 22 from the Digital to Analog Converter/Filter Module 20 and in turn provides a signal labeled $S_{IN}$ to a Signal Controlled Oscillator 30, as well as a signal labeled $S_{MOD}$ to the Signal Controlled Oscillator 60. The Signal Controlled Oscillator 30 in response to receiving the signal $S_{IN}$ from the Control Module 35 will generate a signal having a first frequency that is provided to a Signal Conditioner Module 40. The Signal Conditioner 40 will typically alter the received signal to generate a digital signal, or a signal having specific characteristics, such as specific rise times and/or voltage levels. The output signal generated by the Signal Conditioner 40 has a frequency labeled as the Primary PLL Frequency, and represents the frequency at which the phase locked-loop is locked. The Primary PLL Frequency is provided to a Divider 50 that provides a signal to the phase detector to be compared to the Reference Signal.

Therefore, a phase locked-loop is illustrated in FIG. 1 by the Phase Detector 10, the Digital to Analog Converter/Filter 20, the Control Module 35, the Signal Controlled Oscillator 30, the Signal Conditioner 40, and the Divider 50. As such, each of the nodes connecting these components is a feedback node associated with a closed loop path of the phase locked-loop.

The Signal Controlled Oscillator 60 is not part of the closed loop path forming the phase locked-loop. Instead, the Signal Controlled Oscillator 60 receives a signal labeled $S_{MOD}$ from the Control Module 35 and produces a signal having a frequency labeled Modified PLL Frequency. The signal $S_{MOD}$ is based upon the analog control signal from the Digital to Analog Converter/Filter 20. In one embodiment, where it is desirable for the Modified PLL Frequency generated by the Signal Controlled Oscillator 60 to be the same as the Primary PLL Frequency, the $S_{MOD}$ signal will be substantially the same as the $S_{IN}$ signal. However, the $S_{MOD}$ signal in addition to being affected by the analog control signal from the digital to Analog Converter 20 is also affected by the Frequency Control Signal received at the Control Module 35. The Frequency Control Signal is used by the Control Module 35 to modify the value of the $S_{MOD}$ signal to obtain a Modified PLL Frequency that is different than that of the Primary PLL Frequency. The Modified PLL Frequency can be greater than the Primary PLL Frequency, or may be less than the Primary PLL Frequency depending upon system requirements. Therefore, by changing the value of the Frequency Control Signal provided to the Control Module 35, the Modified PLL Frequency of the Signal Controlled Oscillator 60 can be controlled.

The system illustrated in FIG. 1 is advantageous over the prior art, in that by modifying the Frequency Control Signal, the Modified PLL Frequency can be changed while the lock on the phase locked-loop is maintained. In this manner, the signal having the Modified PLL Frequency can be used to clock system logic portions at a frequency independent of the Primary PLL Frequency. This allows the frequency at which various system components are clocked to be varied without affecting the multiplication/division factor stored within the Divider 50. This assures that the phase locked-loop portion of FIG. 1 remains locked, and allows the Modified PLL Frequency to be changed almost instantaneously in response to a system's need for a higher or lower frequency clock. In a typical system, the amount of logic used to implement the phase locked-loop portion of FIG. 1 is small relative to the system logic being driven by the Modified PLL Frequency. Therefore, the amount of power utilized by maintaining a locked state on the phase locked-loop portion of FIG. 1 at the Primary PLL Frequency is relatively insubstantial to the overall system power usage.

Figure 2:
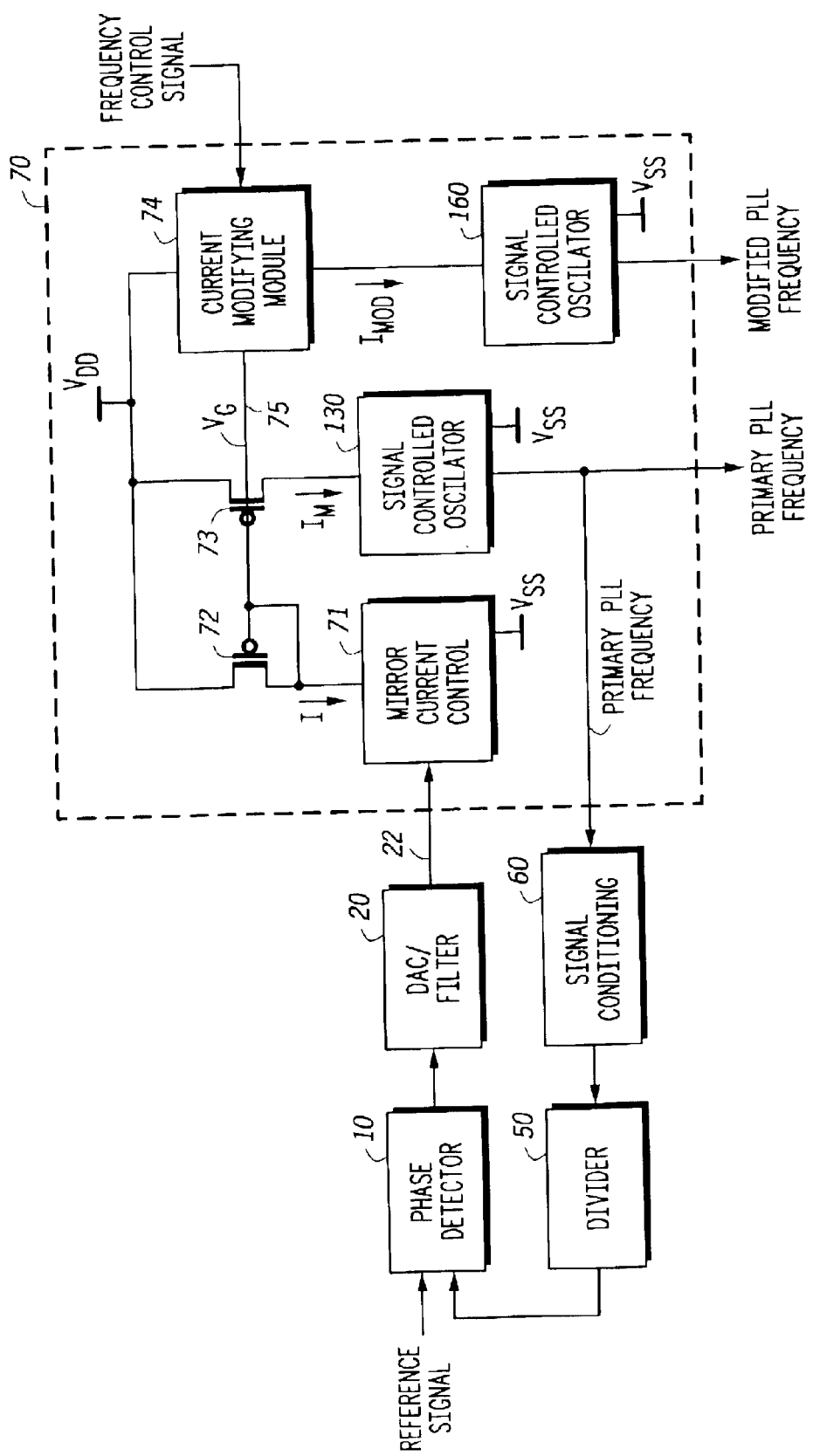
FIG. 2 discloses, in block diagram and schematic form, a more detailed view of an implementation of the system of FIG. 1.

It will be appreciated, that the Signal Control Oscillators 30 and 60 can be controlled based upon a variety of signal types. For example, the Signal Controlled Oscillators 30 and 60 can be a combination of voltage controlled oscillators, or current controlled oscillators, where it will be appreciated that a voltage controlled oscillator is controlled by varying a voltage signal, and that a current controlled oscillator is controlled by varying a current signal. In one embodiment, both of the Signal Controlled Oscillators 30 and 60 can be the same type of oscillator. For example, both may be current controlled oscillators or voltage controlled oscillators. Likewise, the Signal Controlled Oscillators 30 and 60 may be different types of oscillators. For example, the Signal Controlled Oscillator 30 may be a current controlled oscillator while the Signal Controlled Oscillator 60 may be a voltage controlled oscillator. Conversely, the Signal Controlled Oscillator 30 may be a voltage controlled oscillator while the Signal Controlled Oscillator 60 is a current controlled oscillator. FIG. 2 illustrates a specific implementation whereby both the Signal Controlled Oscillator 30 and the Signal Controlled Oscillator 60 are current controlled oscillators.

FIG. 2 illustrates a specific embodiment of FIG. 1 with a Portion 70 of FIG. 1 illustrated in greater detail. Specifically, various aspects of the Control Module 35 of FIG. 1 are illustrated in greater detail.

The Portion 70 illustrated in FIG. 2 includes a Signal Controlled Oscillator 130, corresponding to the Signal Controlled Oscillator 30 of FIG. 1, and a Signal Controlled Oscillator 160, which correlates to the Signal Controlled Oscillator 60 of FIG. 1. In addition, the portion 70 illustrated in FIG. 2 includes a Mirror Current Control 71. The Mirror Current Control 71 receives the Analog Signal 22 from the Digital to Analog Controller 20. The Analog Signal 22 can be either a voltage signal, or a current signal. Based upon the Analog Signal 22, the Mirror Control Portion 71 will cause a current I to flow through the Mirror Transistor 72. The Mirror Transistor 72 is so named in that its drain (current) electrode is tied to its control electrode. As a result, the voltage on the control electrode of Transistor 72 may be applied to other transistors in order to generate a mirrored current. For example, a Mirroring Transistor 73 has a control electrode coupled to the control electrode of the Mirror Transistor 72. As a result, a current $I_M$, which mirrors the current I, is generated at the drain of Transistor 73. It will be appreciated, that the current $I_M$ may be equal to the current I if the Transistors 72 and 73 are matched. Alternatively, the current $I_M$ can represent a current that is proportional to the current I without having identical current values. For example, based upon the scaling of the Transistor 73 relative to Transistor 72, the value of $I_M$ may be greater than or less than the current I.

The signal on the control electrodes of Transistors 72 and 73, labeled $V_G$, is further provided to a Current Modifying Module 74. The Current Modifing Module 74 further receives the Frequency Control Signal. Based upon the Frequency Control Signal, and the signal $V_G$, Current Modifing Module 74 generates signal $I_{MOD}$ that in turn controls the frequency of the signal generated by the Signal Controlled Oscillator 160.

In one mode of operation, the Current Modifying Module 74 will match the value of the signal $I_{MOD}$ to equal that of the current I so that if the Signal Controlled Oscillator 160 is matched to the Signal Controlled Oscillator 130, the Modified PLL Frequency will match the Primary PLL Frequency. The value of Frequency Control Signal provided to the Current Modifying Module 74 can be modified to change the value of the signal $I_{MOD}$ to obtain a Modified PLL Frequency greater than or less than the Primary PLL Frequency. This will be better understood with reference to FIG. 3.

Figure 3:
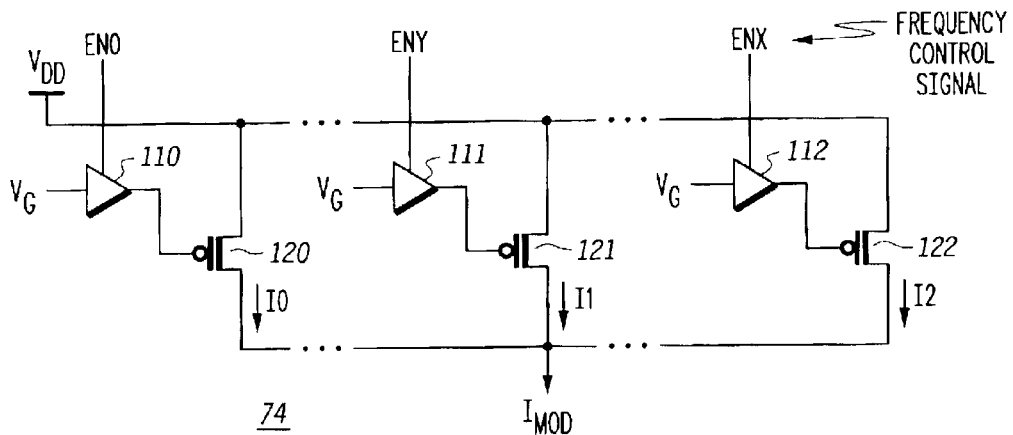
FIG. 3 illustrates, in block and schematic diagram form, a portion of the block diagram of FIG. 2.

FIG. 3 illustrates a combination block and schematic diagram of the Current Modifying Module 74. Specifically, the Current Modifying Module 74 illustrated in FIG. 3 comprises a plurality of Transistors 120–122, a plurality of Switches 110–112 that are used to provide control signals to Transistors 120–122, and a plurality of current modification signals ENO–ENX that are control signals received at Switches 110–112, respectively.

In operation, each of the Switches 110–112 can be controlled independently in order to provide a control signal to the control electrodes of respective Transistors 120–122. Based upon the enabled switches, the current $I_{MOD}$ can be varied. In one embodiment, the Transistor 121 acts as a mirroring transistor in that the control signal received on the input of Switch 111 is equal to, or proportional to, the signal $V_G$ of FIG. 2, which is generated by the Mirror Transistor 72. Therefore, in one mode of operation, when the enable signal ENY is asserted, the voltage $V_G$ is applied to the control gate of Transistor 121, and a current 11 is allowed to flow. By allowing the Transistor 121 to be matched with the Transistor 73 of FIG. 2, the signal $I_{MOD}$ can be selected to match the signal $I_M$, thereby allowing the Signal Controlled Oscillator 130 and the Signal Controlled Oscillator 160 to operate at a common frequency.

Assuming that the current 11 by itself matches the current $I_M$ of FIG. 2, a current greater than $I_M$ can be obtained by enabling one or more of the other current modification signals EN0–ENX. By increasing the amount of current in $I_{MOD}$, in this manner the Signal Controlled Oscillator 160 will receive more current and oscillate at a higher frequency than the Primary PLL Frequency.

Conversely, the amount of current represented by $I_{MOD}$ can be reduced below $I_M$ by disabling the transistor 121, and enabling other transistors, such as 120 and 122, which would allow an amount of current less than $I_M$ to flow. By reducing the current $I_{MOD}$ below the current $I_M$, a lower frequency relative to the Primary PLL Frequency can be obtained. It will be appreciated that when it is desirable to control the frequency of the Signal Controlled Oscillator 160 relative to the Signal Controlled Oscillator 130, that the switches 110–112 will receive a representation of the voltage $V_G$. For example, each Switch 110–112 can receive $V_G$ or a multiple of $V_G$. However, in other embodiments, not all of the inputs to Switches 110–112 need to receive a representation of the voltage $V_G$. For example, only the Switch Controlling Transistor 121 could receive the reference voltage $V_G$ allowing the current $I_{MOD}$ to match the current $I_M$. However, the other Transistors 120–122 can have their control electrodes biased by signals not dependent on $V_G$. In this manner the current controlling the Signal Controlled Oscillator 160 can be varied, dependent or independent of $V_G$.

Figure 4:
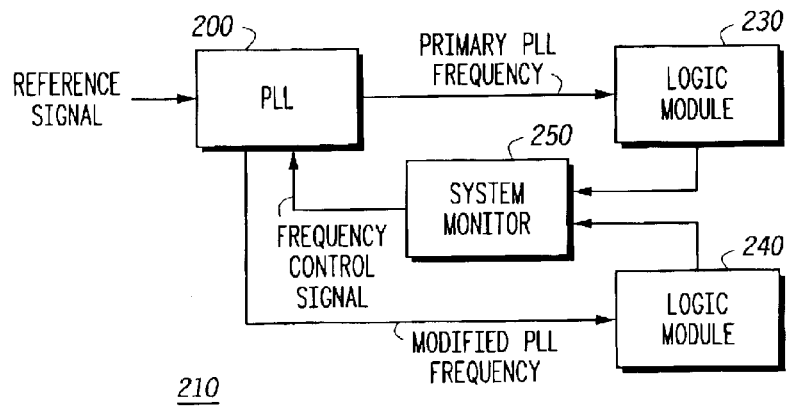
FIG. 4 illustrates, in block diagram form, a specific implementation in accordance with the present disclosure.

FIG. 4 illustrates a system diagram in accordance with a specific implementation. Specifically, FIG. 4 illustrates the Phase Locked-Loop Device 200 generating the Primary PLL Frequency and the Modified PLL Frequency. The Primary PLL Frequency provides clocking to Logic Module 230 while the Modified PLL Frequency provides clocking to a second Logic Module 240. Note that in other embodiments, the Primary PLL Frequency need not drive any system logic.

A System Monitor 250 monitors information associated with the Logic Module 230 and Logic Module 240 in order to determine if the Modified PLL Frequency is appropriate. When the System Monitor 250 determines the Modified PLL Frequency to the Logic Module 240 should change to accommodate the System 210, a Frequency Control Signal provided to the Phase Locked-Loop Device 200 is modified. As previously described, the Phase Locked-Loop Module 200 will provide a Modified PLL Frequency to the Logic Module 240 while maintaining the Primary PLL Frequency to the Logic Module 230. In this manner, lock of the Primary PLL is maintained, and the Modified PLL Frequency is quickly obtained.

Figure 5:
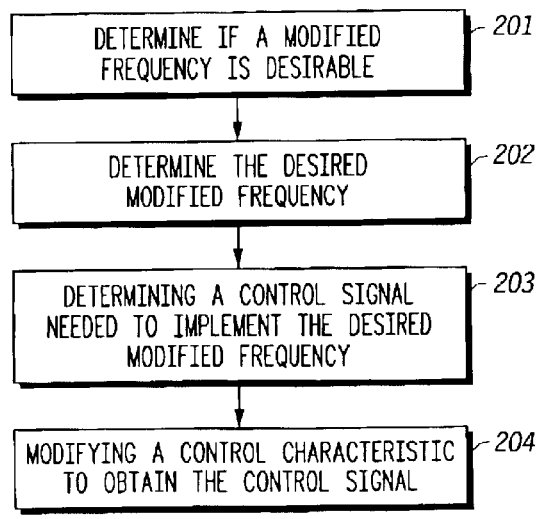
FIG. 5 illustrates, in flow diagram form, a method in accordance with the present disclosure.

FIG. 5 illustrates, in flow diagram form, a method in accordance with the present disclosure. At step 201, it is determined that a modified frequency is desirable. For example, it can be determined by a system parameter that a low power mode of operation is desirable, or alternatively, that a logic portion of the system would benefit by operating at a higher frequency.

At step 202, the desired modified frequency is determined. For example, if it is determined that a low power mode of operation is desirable, the frequency may be reduced. The amount a frequency is reduced can vary depending on the low power functions that need to be supported. For example, if the only function the logic portion will need to facilitate is a reset mode, the frequency can be cut back substantially, for example, by 90% or more.

At step 203, a control signal needed to facilitate implementing the desired modified frequency is determined. By having predefined current ranges associated with the control logic, specific control signals can be determined to implement a signal that will achieve the desired frequency. The frequency ranges needed will be application dependent. For example, some applications may need only two modes of application, such as a low frequency mode and a high frequency mode. While other applications may need a broad frequency range and the ability to select from many frequencies within that range.

At step 204, a control characteristic is modified to obtain the control signal. For example, referring to FIG. 3, the values of the current modifying signals EN0–ENX are modified in order to obtain a control signal $I_{MOD}$. In this manner, the Modified PLL Frequency can be controlled.

Various functions and components in the present application, such as the method of FIG. 5, may be implemented using an information handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the various functions, and systems represented by block diagrams are readily implemented by one of ordinary skill in the art using one or more of the implementation techniques listed herein. When a data processor for issuing instructions is used, the instruction may be stored in memory. Such a memory may be a single memory device or a plurality of memory devices. Such a memory device may be read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. Such an information handling machine may be a system, or part of a system, such as a computer, a personal digital assistant (PDA), a hand held computing device, a cable set-top box, an Internet capable device, such as a cellular phone, and the like.

In the preceding detailed description of the figures, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical, chemical and electrical changes may be made without departing from the spirit or scope of the disclosure. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. The preceding detailed description is, therefore, not to be taken in a limiting sense, and the scope of the present disclosure is defined only by the appended claims.

What is claimed is:

1. A method comprising the steps of:
   receiving a first control signal, wherein the first control signal is an analog control signal;

providing a second control signal based on the first control signal to a first signal controlled oscillator to generate a first signal having a first frequency, wherein the first signal controlled oscillator is in a closed-loop feedback path of a phase-locked-loop;

providing a third control signal based on the first control signal to a second signal controlled oscillator to generate an output a second signal having a second frequency, wherein the second signal controlled oscillator is not in the closed-loop feedback path of the phase-locked-loop; and modifying the third control signal based on a Frequency Control Signal to provide a modified control signal to the second signal controlled oscillator to generate a third signal at the output having a third frequency different than the second frequency while maintaining the first signal for the first signal controlled oscillator.

2. The method of claim 1, wherein providing the second control signal to the first signal controlled oscillator comprises the first control signal being a first current signal and the first signal controlled oscillator being a current controlled oscillator.

3. The method of claim 2, wherein providing the third control signal to the second signal controlled oscillator comprises the third control signal being a second current signal and the second signal controlled oscillator being a current controlled oscillator.

4. The method of claim 2, wherein providing the third control signal to the second signal controlled oscillator comprises the third control signal being a voltage signal and the second signal controlled oscillator being a voltage controlled oscillator.

5. The method of claim 1, wherein providing the second control signal to the signal controlled oscillator comprises the second control signal being a first voltage signal and the first signal controlled oscillator being a voltage controlled oscillator.

6. The method of claim 5, wherein providing the third control signal to the second signal controlled oscillator comprises the third control signal being a second voltage signal and the second signal controlled oscillator being a voltage controlled oscillator.

7. The method of claim 5, wherein providing the third control signal at the second signal controlled oscillator comprises the third control signal being a current signal and the second signal controlled oscillator being a current controlled oscillator.

8. The method of claim 1, wherein the modified frequency is greater than the first frequency.

9. The method of claim 8, wherein modifying the third control signal further comprises the modified control signal being a current signal that comprises a first mirrored current component, wherein in the first mirrored current component is related to a second mirrored current component of the second signal controlled oscillator that is not modified.

10. The method of claim 1, wherein modifying the third control signal further comprises the modified control signal being a current signal that comprises a first mirrored current component, wherein in the first mirrored current component is related to a second mirrored current component of the first signal controlled oscillator that is not modified.

11. The method of claim 1, wherein the third frequency is less than the first frequency.

12. The method of claim 1, wherein the third frequency is greater than the first frequency.

13. The method of claim 1 further comprising:
determining a desired modified frequency; wherein modifying the third control signal comprises determining an amount to modify the third control signal based upon the desired modified frequency.

14. The method of claim 1 further comprising:
determining a desired modified frequency;
determining a digital representation based on the desired modified frequency; and wherein
modifying the third control signal based upon the digital representation of the amount.

15. The method of claim 1 further comprising:
maintaining a phase-locked state of the phase-locked-loop when modifying the second control signal to generate the modified frequency.

16. A system comprising:
a phase-locked loop comprising
a mirror transistor having current electrode and a control electrode coupled to the current electrode;
a first mirroring transistor having a based electrode coupled to the control electrode of the mirror transistor, and a first current electrode;
a first signal controlled oscillator having in input coupled to the first current electrode of the first mirroring transistor to generate a first frequency;
a second mirroring transistor having a control electrode coupled to the control electrode of the mirror transistor, and a first current electrode;
a third transistor having a control electrode, and a first current electrode coupled to the first current electrode of the second transistor;
a switch having a control input responsive to a current modification signal, a data in node, and a data out node coupled to the control electrode of the third transistor; and
a second signal controlled oscillator having in input coupled to first current electrode of the second transistor to generate a second frequency.

17. The system of claim 16, wherein the first signal controlled oscillator is a current controlled oscillator.

18. The system of claim 17, wherein the second signal controlled oscillator is a current controlled oscillator.

19. The system of claim 17, wherein the second signal controlled oscillator is a voltage controlled oscillator.

20. The system of claim 16, wherein the first signal controlled oscillator is a voltage controlled oscillator.

21. The system of claim 20, wherein the first signal controlled oscillator is a voltage controlled oscillator.

22. The system of claim 20, wherein the characteristic of the control signal is a current controlled oscillator.

23. The system of claim 16, wherein the data in node of the switch is coupled to the base of the mirror transistor.

24. A method of controlling a frequency of system operation comprising:
generating a phase-locked-loop frequency at a first oscillator based on a signal at a feedback node of a phase-locked-loop;
generating a second frequency at an output of a second oscillator based on the signal;
determining a low-power mode of operation is desirable;
modifying a control characteristic of the second oscillator to generate a third frequency at the output of second oscillator, when it is determined a low-power mode of operation is desirable.

25. The method of claim 24, wherein the second frequency is substantially the same as the phase-locked-loop frequency.

26. The method of claim 25, wherein the third frequency is different than the phase-locked-loop frequency.

27. The method of claim 26 further comprising;
maintaining a phase-locked state of the phase-locked-loop when modifying the control characteristic.

* * * * *